(12) United States Patent
Lee et al.

(10) Patent No.: US 10,734,490 B1
(45) Date of Patent: Aug. 4, 2020

(54) BIPOLAR JUNCTION TRANSISTOR (BJT) WITH 3D WRAP AROUND EMITTER

(71) Applicant: International Business Machines Corporation, Armonk, NY (US)

(72) Inventors: Choonghyun Lee, Rensselaer, NY (US); Injo Ok, Loudonville, NY (US); Shogo Mochizuki, Clifton Park, NY (US); Soon-Cheon Seo, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/362,040

(22) Filed: Mar. 22, 2019

(51) Int. Cl.
*H01L 29/417* (2006.01)
*H01L 29/423* (2006.01)
(Continued)

(52) U.S. Cl.
CPC .. *H01L 29/41708* (2013.01); *H01L 21/02381* (2013.01); *H01L 21/2254* (2013.01); *H01L 21/26506* (2013.01); *H01L 21/76831* (2013.01); *H01L 29/0804* (2013.01); *H01L 29/1004* (2013.01); *H01L 29/165* (2013.01); *H01L 29/42304* (2013.01); *H01L 29/66242* (2013.01); *H01L 29/66318* (2013.01); *H01L 29/7378* (2013.01)

(58) Field of Classification Search
CPC ............. H01L 29/0804; H01L 29/0813; H01L 29/0817; H01L 29/0821; H01L 29/1004; H01L 29/66234–66318; H01L 29/73–7378
See application file for complete search history.

(56) References Cited

U.S. PATENT DOCUMENTS 5,583,059 A  12/1996  Burghartz
7,544,577 B2   6/2009  Adam et al.
(Continued)

FOREIGN PATENT DOCUMENTS

GB  2425400 A  10/2006

OTHER PUBLICATIONS

Stephen H. Voldman, "ESD RF Technology and Circuits," John Wiley & Sons, Ltd., Sep. 2006, Cover and Chapter 5, pp. 183-216.
(Continued)

*Primary Examiner* — Zandra V Smith
*Assistant Examiner* — Molly K Reida
(74) *Attorney, Agent, or Firm* — Vazken Alexanian; Michael J. Chang, LLC

(57) ABSTRACT

BJT devices with 3D wrap around emitter are provided. In one aspect, a method of forming a BJT device includes: forming a substrate including a first doped layer having a dopant concentration of from about $1\times10^{20}$ at. % to about $5\times10^{20}$ at. % and ranges therebetween, and a second doped layer having a dopant concentration of from about $1\times10^{15}$ at. % to about $1\times10^{18}$ at. % and ranges therebetween, wherein the first and second doped layers form a collector; patterning a fin(s) in the substrate; forming bottom spacers at a bottom of the fin(s); forming a base(s) that wraps around the fin(s); forming an emitter(s) that wraps around the base(s); and forming sidewall spacers alongside the emitter(s). A BJT device is also provided.

20 Claims, 9 Drawing Sheets

(51) Int. Cl.
    *H01L 21/768*     (2006.01)
    *H01L 21/265*     (2006.01)
    *H01L 21/225*     (2006.01)
    *H01L 29/737*     (2006.01)
    *H01L 29/08*     (2006.01)
    *H01L 29/10*     (2006.01)
    *H01L 21/02*     (2006.01)
    *H01L 29/66*     (2006.01)
    *H01L 29/165*     (2006.01)

(56) References Cited

U.S. PATENT DOCUMENTS

| | | |
|---|---|---|
| 7,786,510 B2 | 8/2010 | Shim et al. |
| 8,492,794 B2 | 7/2013 | Cai et al. |
| 8,742,538 B2 | 6/2014 | Qian |
| 9,525,027 B2 | 12/2016 | Hashemi et al. |
| 9,673,294 B2 | 6/2017 | Tschumakow et al. |
| 9,780,089 B2 | 10/2017 | Tsai et al. |
| 9,831,328 B2 | 11/2017 | Shyu et al. |
| 9,953,979 B2 | 4/2018 | Xu et al. |
| 9,997,619 B1 | 6/2018 | Balakrishnan et al. |
| 2009/0146258 A1 | 6/2009 | Zhang et al. |
| 2011/0215344 A1 | 9/2011 | Dardy et al. |
| 2013/0075729 A1* | 3/2013 | Xia .................. H01L 29/66272 257/51 |
| 2018/0240898 A1 | 8/2018 | Tao et al. |
| 2019/0157434 A1* | 5/2019 | Balakrishnan ........ H01L 21/743 |

OTHER PUBLICATIONS

Cheung et al., "Buried dopant and defect layers for device structures with high-energy ion implantation," Nuclear Instruments and Methods in Physics Research Section B: Beam Interactions with Materials and Atoms, vols. 37-38, pp. 941-950 (Feb. 1989).

Adhikari et al., "High Mobility SiGe Shell-Si core Omega Gate pFETs," 2009 International Symposium on VLSI Technology, Systems, and Applications, pp. 136-138 (Apr. 2009).

Kennedy et al., "Phosphorous monolayer doping (MLD) of silicon on insulator (SOI) substrates," Beilstein J. Nanotechnol. 2018, 9, pp. 2106-2113 (Aug. 2018).

Ho et al., "Controlled nanoscale doping of semiconductors via molecular monolayers," nature materials, vol. 7, Jan. 2008 (Published Nov. 2007) (16 total pages).

Qin et al., "PLAD (Plasma Doping) on 22nm Technology Node and Beyond—Evolutionary and/or Revolutionary" 2012 12th International Workshop on Junction Technology (May 2012) (12 total pages).

L.L. Liou et al., "The Effect of Thermal Shunt on the Current Instability of Multiple-Emitter-Finger Heterojunction Bipolar Transistors," IEEE 1993 Bipolar Circuits and Technology Meeting, pp. 253-256 (Oct. 1993).

Rinaldi et al., "Theory of Electrothermal Behavior of Bipolar Transistors: Part II—Two-Finger Devices," IEEE Transactions on Electron Devices, vol. 52, No. 9, pp. 2022-2033 (Sep. 2005).

Pei et al., "High-Power SiGe Heterojunction Bipolar Transistor (HBT) with multiple emitter fingers," Extended Abstracts—2008 8th International Workshop on Junction Technology (IWJT '08) (May 2008) (4 pages).

Jin et al., "Optimum Design Methodology for Thermally Stable Multi-finger Power SiGe HBTs," 2010 International Workshop on Junction Technology Extended Abstracts (May 2010) (4 pages).

* cited by examiner

US 10,734,490 B1

BIPOLAR JUNCTION TRANSISTOR (BJT) WITH 3D WRAP AROUND EMITTER

FIELD OF THE INVENTION

The present invention relates to bipolar junction transistors (BJTs), and more particularly, to a BJT structure with three-dimensional (3D) wrap around emitter and techniques for fabrication thereof.

BACKGROUND OF THE INVENTION

A bipolar junction transistor (BJT) is a three-terminal device having two P-N junctions between n-type and p-type semiconductor materials that can be arranged in a PNP and NPN configuration. The three terminals are often referred to as an emitter, a base, and a collector.

High power bipolar transistors can have multiple emitters to achieve high currents, and to provide efficient use of the whole emitter area. These emitters experience high current densities and are self-heated above ambient temperatures, leading to concerns about thermal run-away and damage to the device.

Large area bipolar transistors can also have a very non-uniform current distribution due to the resistance of the base layer. Since the base current is applied through a thin base layer, there can be a significant series resistance in large devices. This resistance causes a voltage variation across the base region. This voltage variation then causes a variation of the emitter current density, especially since the emitter current density depends exponentially on the local base-emitter voltage. This effect is minimal in the center of the emitter-base junction and strongly increases toward the edges. In extreme cases, this effect causes the emitter current to occur only at the very edges of the emitter-base junction. The parameters involved include the sheet resistance of the base layer, the emitter current density and the current gain in the device.

Therefore, improved multiple-emitter BJT designs with reduced resistance, and techniques for fabrication thereof, would be desirable.

SUMMARY OF THE INVENTION

The present invention provides a bipolar junction transistor (BJT) structure with three-dimensional (3D) wrap around emitter. In one aspect of the invention, a method of forming a BJT device is provided. The method includes: forming a substrate including a first doped layer having a dopant concentration of from about $1\times10^{20}$ atomic percent (at. %) to about $5\times10^{20}$ at. % and ranges therebetween, and a second doped layer disposed on the first doped layer having a dopant concentration of from about $1\times10^{15}$ at. % to about $1\times10^{18}$ at. % and ranges therebetween, wherein the first doped layer and the second doped layer form a collector of the BJT device; patterning at least one fin in the substrate; forming bottom spacers at a bottom of the at least one fin; forming at least one base that wraps around the at least one fin; forming at least one emitter that wraps around the at least one base; and forming sidewall spacers alongside the at least one emitter.

In another aspect of the invention, a BJT device is provided. The BJT device includes: a substrate including a first doped layer having a dopant concentration of from about $1\times10^{20}$ at. % to about $5\times10^{20}$ at. % and ranges therebetween, and a second doped layer disposed on the first doped layer having a dopant concentration of from about $1\times10^{15}$ at. % to about $1\times10^{18}$ at. % and ranges therebetween, wherein the first doped layer and the second doped layer form a collector of the BJT device; at least one fin patterned in the substrate that extends partway through the second doped layer; bottom spacers disposed at a bottom of the at least one fin; at least one base that wraps around the at least one fin; at least one emitter that wraps around the at least one base; sidewall spacers disposed alongside the at least one emitter; a dielectric surrounding the BJT device; a first contact in the dielectric to the at least one base; a second contact in the dielectric to the at least one emitter; and at least one third contact in the dielectric to the collector.

A more complete understanding of the present invention, as well as further features and advantages of the present invention, will be obtained by reference to the following detailed description and drawings.

DETAILED DESCRIPTION OF PREFERRED EMBODIMENTS

As provided above, multiple emitter bipolar junction transistor (BJT) designs experience high current densities thus raising concerns about thermal run-away and damage to the device. Further, large area bipolar transistors can experience a non-uniform current distribution due to the resistance of the base layer. Advantageously, provided herein are multi-emitter silicon germanium (SiGe) heterojunction BJT designs having a three-dimensional (3D) wrap around emitter. With the present BJT design, the current flow from the collector through the base occurs in 3D outwardly toward the wrap around emitter. The collector, which is highly doped, serves as a conductor that collects all of the electrons from the base and sends them to the contact.

A heterojunction BJT employs different semiconductor materials for the emitter and the base to create a heterojunction. A SiGe heterojunction BJT has several advantages over conventional ion-implanted silicon (Si)-BJTs. Namely, with SiGe heterojunction BJTs there is a reduction in base-transit time resulting in higher frequency performance, there is an increase in collector current density and hence higher current gain, and there is an increase in Early voltage at a particular cutoff frequency.

The base-transit time can be further reduced by building into the base a drift field that aids the flow of electrons from the emitter to the collector. This can be accomplished in a couple of different ways. One technique is to use graded base doping which gradually decreases toward the collector-base (CB) junction. The bandgap EgB decreases from emitter end to collector end. See, for example, U.S. Patent Application Publication Number 2011/0215344 by Dardy et al., entitled "Low Power Graded Base SiGe HBT Light Modulator" (hereinafter "Dardy"), the contents of which are incorporated by reference as if fully set forth herein.

The present SiGe heterojunction BJT design employs a unique wrap around emitter configuration which permits current to flow from the base to the emitter along paths in three-dimensions (3D). This wrap around emitter design advantageously reduces current crowding and self-heating concerns.

Figure 1:
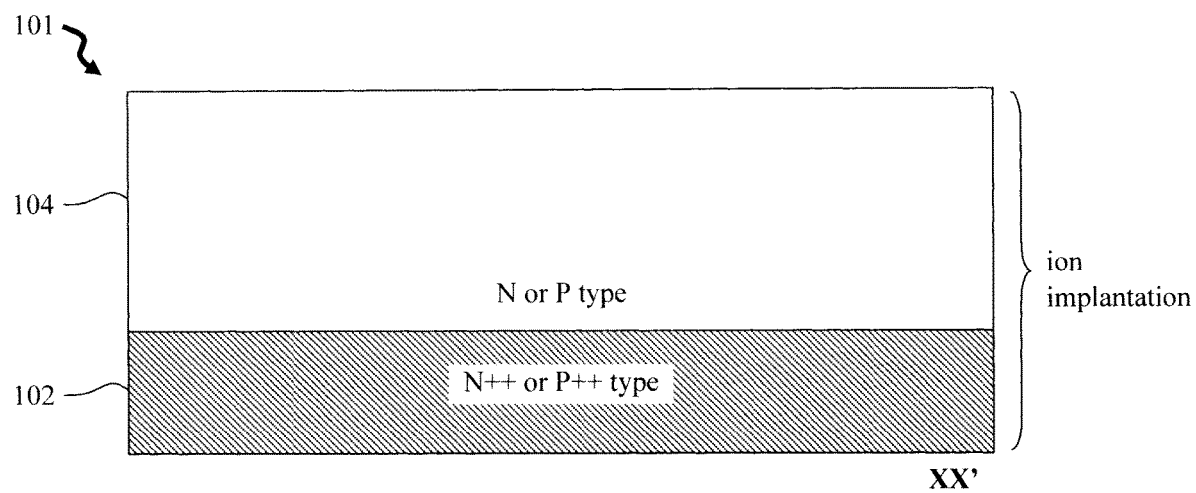
FIG. 1 is a cross-sectional diagram illustrating a substrate having been formed that includes a (first) highly doped N-type or P-type (N++ or P++ type) layer, and a (second) lightly doped N-type or P-type (N or P type) layer according to an embodiment of the present invention.

An exemplary methodology for forming a BJT device in accordance with the present techniques is now described by way of reference to FIGS. 1-18. A shown in FIG. 1, the process begins with the formation of a substrate 101 that includes two doped layers. The first doped layer is a highly doped N-type or P-type (N++ or P++ type) layer 102, and the second doped layer is a lightly doped N-type or P-type (N or P type) layer 104 formed on the N++ or P++ type layer 102. As will be described in detail below, N++ or P++ type layer 102 and N or P type layer 104 form the collector of the BJT, whereby the N++ or P++ type layer 102 serves to reduce the contact/series resistivity. Each of layers 102 and 104 can be doped with an n-type or p-type dopant depending on the configuration of the BJT. For instance, in one exemplary embodiment the collector, base and emitter are all n-type. In that case, layers 102 and 104, as well as the base and the emitter (see below) are each doped with an n-type dopant(s) at their respective dopant concentrations (see below). Suitable n-type dopants include, but are not limited to, phosphorous (P) and/or arsenic (As). Alternatively, in another exemplary embodiment the collector, base and emitter are all p-type. In that case, layers 102 and 104, as well as the base and the emitter are each doped with a p-type dopant(s) at their respective dopant concentrations. Suitable p-type dopants include, but are not limited to, boron (B).

According to an exemplary embodiment, N++ or P++ type layer 102 has a thickness of from about 10 nanometers (nm) to about 100 nm and ranges therebetween, and a dopant concentration of from about $1\times10^{20}$ atomic percent (at. %) to about $5\times10^{20}$ at. % and ranges therebetween (which is considered herein to be "highly doped"). According to an exemplary embodiment, N or P type layer 104 has a thickness of from about 20 nm to about 150 nm and ranges therebetween, and a dopant concentration of from about $1\times10^{15}$ at. % to about $1\times10^{18}$ at. % and ranges therebetween (which is considered herein to be "lightly doped").

According to an exemplary embodiment, substrate 101 is formed from silicon (Si) or a Si-containing material such as silicon carbide (SiC) with N++ or P++ type layer 102 and N or P type layer 104 doped (n-type or p-type) accordingly. Substrate 101 can be formed in a number of different ways. For instance, in one exemplary embodiment, ion implantation is performed to introduce the n-type or p-type dopant(s) into a (e.g., bulk or semiconductor-on-insulator (SOI)) wafer. A SOI wafer includes an SOI layer separated from an underlying substrate by a buried insulator. When the buried insulator is an oxide it is referred to herein as a buried oxide or BOX.

By way of example only, a high energy ion implantation process can be used to bury a highly doped concentration (see above) of dopants into a lightly doped (e.g., Si) wafer, forming N++ or P++ type layer 102 beneath N or P type layer 104. High energy ion implantation is described, for example, in Cheung et al., "Buried dopant and defect layers for device structures with high-energy ion implantation," Nuclear Instruments and Methods in Physics Research Section B: Beam Interactions with Materials and Atoms, volumes 37-38, pp. 941-950 (February 1989), the contents of which are incorporated by reference as if fully set forth herein. Following the ion implantation, an activation anneal is performed. According to an exemplary embodiment, the activation anneal is performed at a temperature of from about 400 degrees Celsius (°C.) to about 1000° C. and ranges therebetween.

Alternatively, embodiments are contemplated herein where N++ or P++ type layer 102 and N or P type layer 104 are grown on a blanket wafer (not shown) using an epitaxial growth process. In that case, doping can be performed in-situ (i.e., during growth) or ex-situ (e.g., by ion implantation). For instance, by way of example only, a layer of highly doped epitaxial Si can be grown on the blanket wafer to form N++ or P++ type layer 102. Next, a layer of lightly doped epitaxial Si can be grown on N++ or P++ type layer 102 to form N or P type layer 104.

It is notable that the cross-sectional views provided in the figures depict a cut XX' through the BJT structure. The orientation of cut XX' is explained by reference to the top-down view shown, for example, in FIG. 12 (described below).

At least one fin 202 is then patterned in the substrate. See FIG. 2. For illustrative purposes only, fins 202a and 202b are shown in the present example. To pattern the fins, standard lithography and etching techniques are first used to pattern fin hardmasks 201a and 201b on the N or P type layer 104, marking the footprint and location of fins 202a and 202b. Suitable materials for fin hardmasks 201a and 201b include, but are not limited to, nitride hardmask materials such as silicon nitride (SiN).

Figure 2:
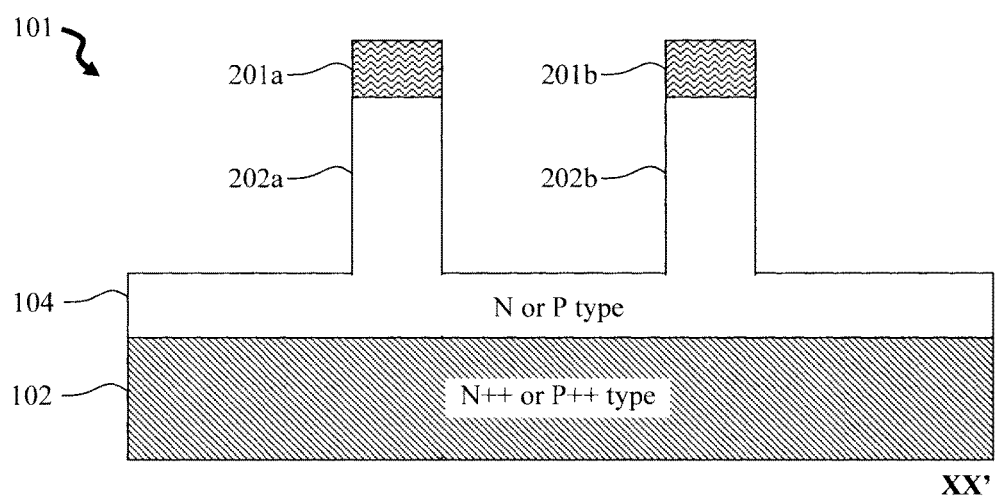
FIG. 2 is a cross-sectional diagram illustrating at least one fin having been patterned in the substrate according to an embodiment of the present invention.
Figure 3:
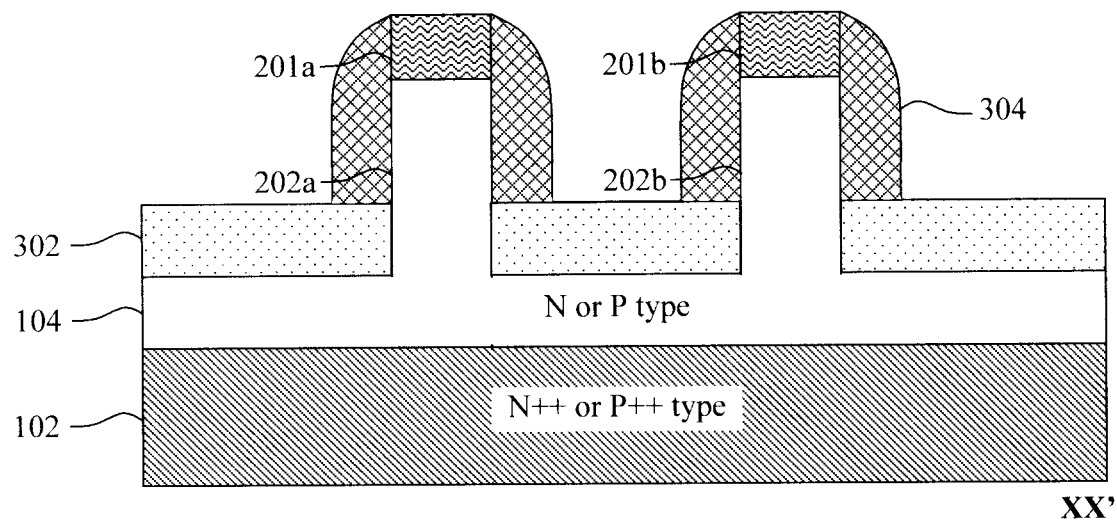
FIG. 3 is a cross-sectional diagram illustrating sacrificial bottom spacers having been formed at the bottom of the fins, and sacrificial sidewall spacers having been formed alongside the fins above the sacrificial bottom spacers according to an embodiment of the present invention.

An etch is then performed to pattern fins 202a and 202b in the N or P type layer 104 using the fin hardmasks 201a and 201b. According to an exemplary embodiment, a directional (anisotropic) etching process such as reactive ion etching (RIE) is used for the fin etch. As shown in FIG. 2, fins 202a and 202b, as patterned, extend only partway through N or P type layer 104.

Sacrificial bottom spacers 302 are then formed at the bottom of fins 202a and 202b. See FIG. 3. By 'sacrificial,' it is meant that the bottom spacers 302 will be removed later on in the process. Suitable materials for sacrificial bottom spacers 302 include, but are not limited to, oxide spacer materials such as silicon dioxide ($SiO_2$) and/or silicon oxycarbide (SiOC) and/or nitride spacer materials such as SiN and/or silicon-boron-nitride (SiBN). It is notable that the selection of material for use in sacrificial bottom spacers 302 depends on the material used for sacrificial sidewall spacers 304 (see below) and vice versa. Namely, sacrificial bottom spacers 302 and sacrificial sidewall spacers 304 are formed from different materials, which enables the subsequent removal of sacrificial bottom spacers 302 selective to sacrificial sidewall spacers 304 (see below). Thus, for instance, if sacrificial bottom spacers 302 are formed from an oxide spacer material (e.g., $SiO_2$ and/or SiOC), then sacrificial sidewall spacers 304 could be formed from a nitride spacer material (e.g., SiN and/or SiBN). Conversely, if sacrificial bottom spacers 302 are formed from a nitride spacer material (e.g., SiN and/or SiBN), then sacrificial sidewall spacers 304 could be formed from an oxide spacer material (e.g., $SiO_2$ and/or SiOC).

According to an exemplary embodiment, sacrificial bottom spacers 302 are formed using a directional deposition process whereby the spacer material is deposited onto N or P type layer 104 and fins 202a and 202b with a greater amount of the material being deposited on horizontal surfaces (including on the exposed top surface of N or P type layer 104 in between fins 202a and 202b), as compared to vertical surfaces (such as along sidewalls of fins 202a and 202b). Thus, when an etch is used on the spacer material, the timing of the etch needed to remove the spacer material from the vertical surfaces will leave the sacrificial bottom spacers 302 shown in FIG. 3 on N or P type layer 104 since a greater amount of the spacer material was deposited on N or P type layer 104 to begin with. By way of example only, a high-density plasma (HDP) chemical vapor deposition (CVD) or physical vapor deposition (PVD) process can be used for directional film deposition, and an oxide- or nitride-selective (depending on the spacer material) isotropic etch can be used to remove the (thinner) spacer material deposited onto the vertical surfaces.

As highlighted above, sacrificial sidewall spacers 304 are then formed alongside fins 202a and 202b/fin hardmasks 201a and 201b above the sacrificial bottom spacers 302. Namely, the sacrificial bottom spacers 302 mask the bottom of fins 202a and 202b. As will be described in detail below, the sacrificial bottom spacers 302 can be selectively removed thereby exposing the bottom of fins 202a and 202b, after which an etch can be performed to thin the bottom of fins 202a and 202b.

Suitable materials for the sacrificial sidewall spacers 304 include, but are not limited to, oxide spacer materials such as $SiO_2$ and/or SiOC and/or nitride spacer materials such as SiN and/or SiBN. However, as provided above, the material used for sacrificial sidewall spacers 304 should provide etch selectivity vis-à-vis the material used for sacrificial bottom spacers 302, and vice versa. Thus, for instance, if sacrificial bottom spacers 302 are formed from an oxide spacer material (e.g., $SiO_2$ and/or SiOC), then sacrificial sidewall spacers 304 could be formed from a nitride spacer material (e.g., SiN and/or SiBN). Conversely, if sacrificial bottom spacers 302 are formed from a nitride spacer material (e.g., SiN and/or SiBN), then sacrificial sidewall spacers 304 could be formed from an oxide spacer material (e.g., $SiO_2$ and/or SiOC).

Sacrificial sidewall spacers 304 can be formed by first blanket depositing the spacer material onto the BJT structure including along the sidewalls of fins 202a and 202b. A directional (anisotropic) etching process such as RIE can then be used to pattern the spacer into the individual sacrificial sidewall spacers 304 shown in FIG. 3.

The sacrificial bottom spacers 302 are then selectively removed. See FIG. 4. As provided above, sacrificial bottom spacers 302 and sacrificial sidewall spacers 304 are formed from different materials enabling removal of the former selective to the latter. Removal of sacrificial bottom spacers 302 exposes the bottom of fins 202a and 202b beneath sacrificial sidewall spacers 304.

Optionally, the exposed bottom of fins 202a and 202b is next thinned beneath sacrificial sidewall spacers 304. See FIG. 5. A non-directional (isotropic) wet or dry etching process can be used to thin the exposed bottom of fins 202a and 202b. Thinning the bottom of fins 202a and 202b enlarges the surface area of the fins 202a and 202b around which the base will be formed (i.e., the thinning creates a shoulder at the bottom of each fin). However, to simplify the process flow, one can forego thinning the bottom of fins 202a and 202b. See, for example, the alternative embodiment shown in FIGS. 17 and 18—described below. When thinning of the bottom of fins 202a and 202b is not performed, the steps illustrated in FIGS. 3-5 can be eliminated (since these steps serve to selectively expose the bottom of fins 202a and 202b for thinning), and the process flow can progress from the structure shown in FIG. 2 directly to that shown in FIG. 6 (described below) albeit without any thinning of fins 202a and 202b.

Figure 4:
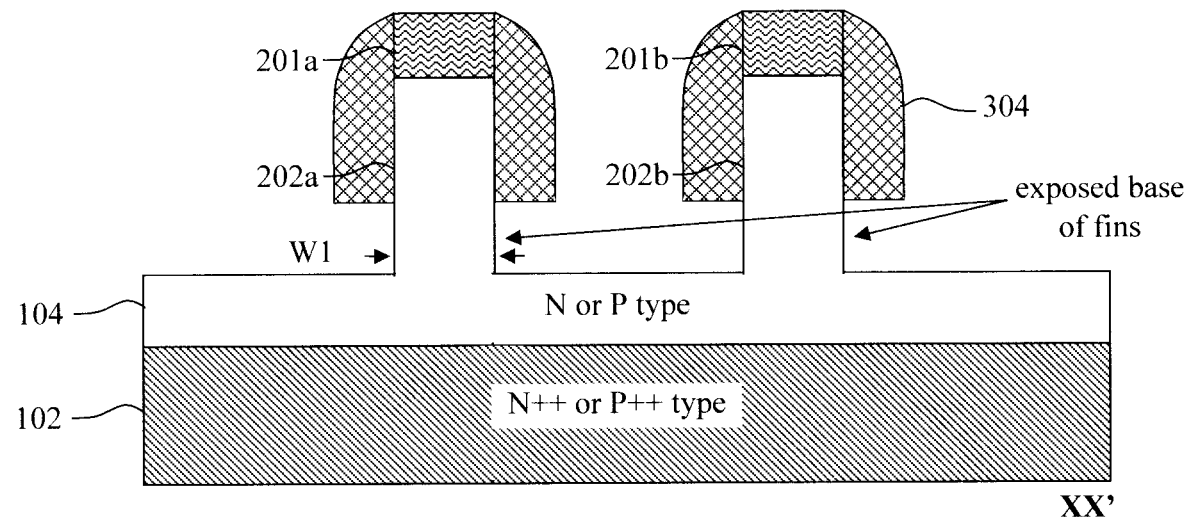
FIG. 4 is a cross-sectional diagram illustrating the sacrificial bottom spacers having been selectively removed according to an embodiment of the present invention.
Figure 5:
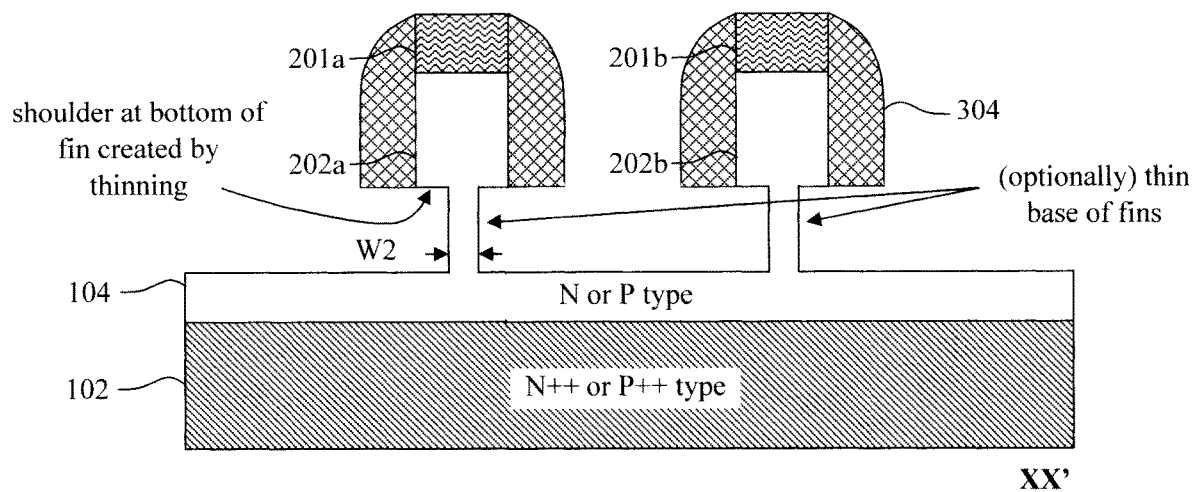
FIG. 5 is a cross-sectional diagram illustrating the exposed bottom of the fins having optionally been thinned beneath sacrificial sidewall spacers according to an embodiment of the present invention.
Figure 6:
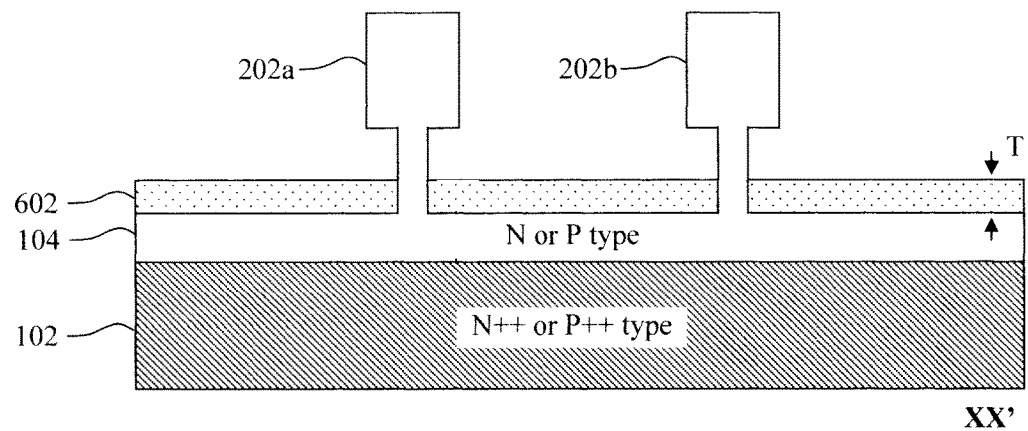
FIG. 6 is a cross-sectional diagram illustrating the sacrificial sidewall spacers having been removed from the fins, and replacement bottom spacers having been formed at the bottom of the fins according to an embodiment of the present invention.
Figure 7:
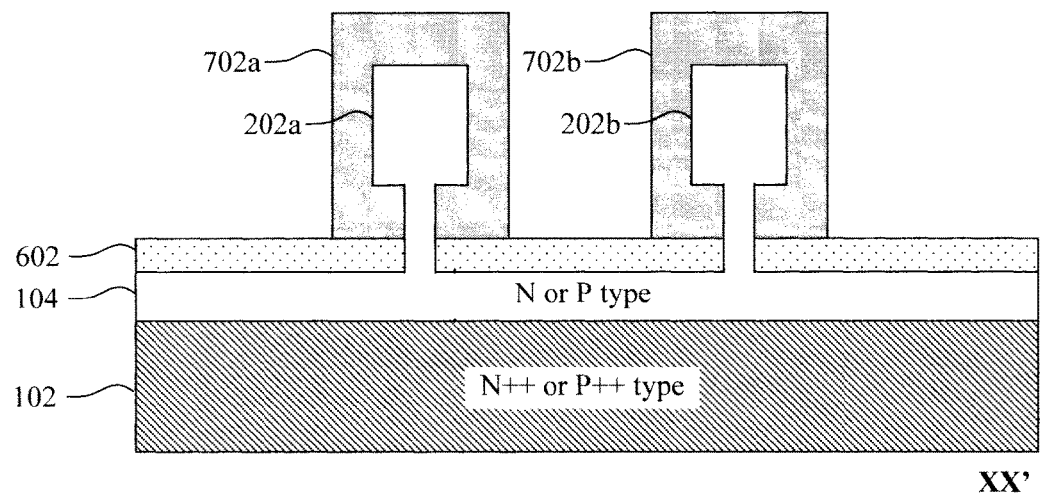
FIG. 7 is a cross-sectional diagram illustrating bases having been formed wrapping around the fins according to an embodiment of the present invention.

Comparing FIG. 4 and FIG. 5, prior to thinning the bottom of fins 202a and 202b have a width W1, and after thinning they have a width W2, where W1>W2. By way of example only, according to an exemplary embodiment, W1 is from about 3 nm to about 8 nm and ranges therebetween, and W2 is from about 1 nm to about 5 nm and ranges therebetween.

Fin hardmasks 201a/201b and sacrificial sidewall spacers 304 are then removed from the fins 202a and 202b. See FIG. 6. A selective wet or dry etching process can be used to remove the fin hardmasks 201a/201b and sacrificial sidewall spacers 304. For instance, by way of example only, when the fin hardmasks 201a/201b and sacrificial sidewall spacers 304 are formed from a nitride material, then a nitride selective etch such as a nitride-selective RIE can be used to clear the fin hardmasks 201a/201b and sacrificial sidewall spacers 304.

Following removal of fin hardmasks 201a/201b and sacrificial sidewall spacers 304, replacement bottom spacers 602 are formed at the bottom of fins 202a and 202b. See FIG. 6. The term "replacement" may be used herein to describe structures (such as bottom spacers 602 or replacement sidewall spacers—see below) which replace their sacrificial counterparts that have been removed, and there are instances where the "replacement bottom spacers" and "replacement sidewall spacers" are referred to simply as "bottom spacers" and "sidewall spacers," respectively, of the BJT device. Further, for clarity, replacement bottom spacers 602 may also be referred to herein as "second bottom spacers" to differentiate them from sacrificial bottom spacers 302 which also may be referred to herein as "first bottom spacers." Replacement bottom spacers 602 separate the collector from the base/emitter. Suitable materials for bottom spacers 602 include, but are not limited to, oxide spacer materials such as $SiO_2$ and/or SiOC and/or nitride spacer materials such as SiN and/or SiBN.

Replacement bottom spacers 602 can also be formed using a directional deposition process such as HDP CVD or PVD. As described above, with a directional deposition process the spacer material is deposited with a greater amount of the material being deposited on horizontal surfaces, as compared to vertical surfaces. Thus, when an etch is used on the spacer material, the timing of the etch needed to remove the spacer material from the vertical surfaces will leave the replacement bottom spacers 602 shown in FIG. 6 on N or P type layer 104 at the bottom of fins 202a and 202b. According to an exemplary embodiment, replacement bottom spacers 602 are formed having a thickness T of from about 2 nm to about 10 nm and ranges therebetween.

Bases 702a and 702b are then formed wrapping around fins 202a and 202b, respectively. See FIG. 7. According to an exemplary embodiment, bases 702a and 702b are formed from silicon germanium (SiGe) or a SiGe-containing material such as silicon-germanium-carbon (SiGeC). Bases 702a and 702b can be formed conformally on fins 202a and 202b using an epitaxial growth process. See, for example, Adhikari et al., "High Mobility SiGe Shell-Si core Omega Gate pFETs," 2009 International Symposium on VLSI Technology, Systems, and Applications, pp. 136-138 (April 2009), the contents of which are incorporated by reference as if fully set forth herein. According to an exemplary embodiment, bases 702a and 702b are formed having a thickness of from about 2 nm to about 10 nm and ranges therebetween, or until the bases 702a and 702b close up the gap with the replacement bottom spacers 602 at the bottom of fins 202a and 202b. See FIG. 7.

Bases 702a and 702b are lightly doped with an n-type or p-type dopant. Suitable n-type and p-type dopants were provided above. According to an exemplary embodiment, bases 702a and 702b have a dopant concentration of from about $1\times10^{15}$ at. % to about $1\times10^{18}$ at. % and ranges therebetween. Preferably, doping in the bases 702a and 702b is done on a gradient, whereby a greatest concentration of the (n-type or p-type) dopant occurs at the outer surfaces of bases 702a and 702b and gradually decreases moving in towards the fins 202a and 202b. For instance, by way of example only, the dopant concentration decreases by from about $1.5\times10^{16}$ at. % to about $2\times10^{16}$ at. % and ranges therebetween every from about 10 nm to about 50 nm and ranges therebetween moving in from the surface of the bases 702a and 702b. This dopant gradient in the bases 702a and 702b can be achieved in a number of different ways. For instance, the (n-type or p-type) dopant(s) can be introduced (in-situ) during epitaxial growth of bases 702a and 702b while regulating the amount of dopant introduced as a function of growth time to create the gradient. Alternatively, as illustrated in FIGS. 8 and 9, an ex-situ doping process can be employed whereby a dopant source layer is placed over the bases 702a and 702b (containing the n-type or p-type dopant) followed by a drive-in anneal to introduce the dopants from the source layer into bases 702a and 702b.

Figure 8:
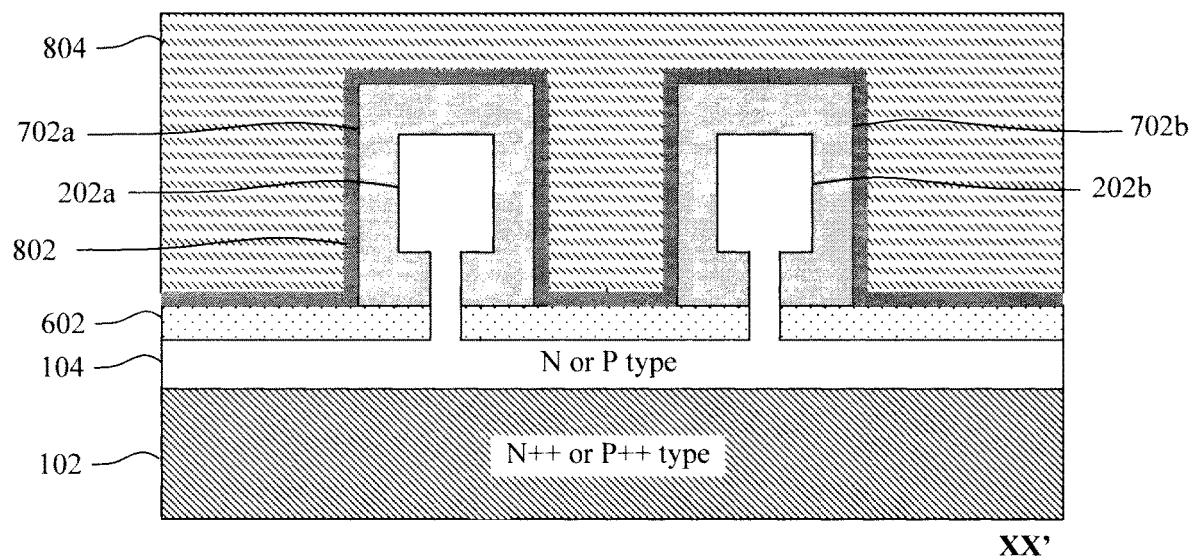
FIG. 8 is a cross-sectional diagram illustrating a conformal dopant source layer having been formed on the bases, and the fins having been buried in a dielectric according to an embodiment of the present invention.
Figure 9:
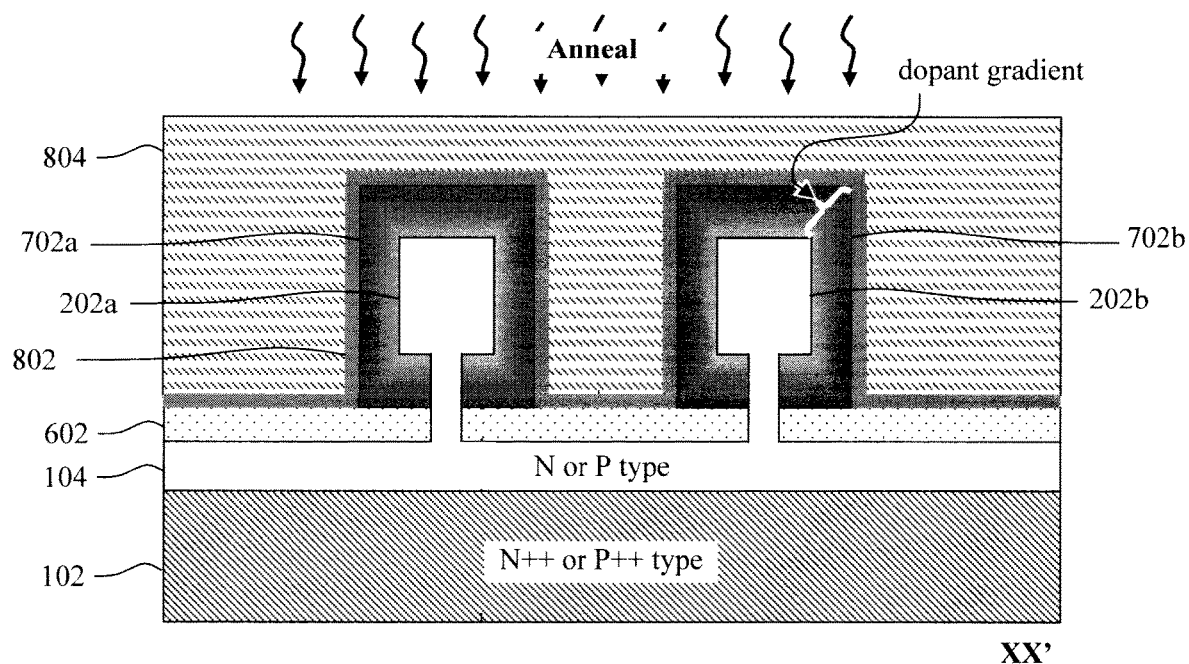
FIG. 9 is a cross-sectional diagram illustrating anneal of the fins having been then performed to drive in dopants from the dopant source layer into the bases according to an embodiment of the present invention.
Figure 10:
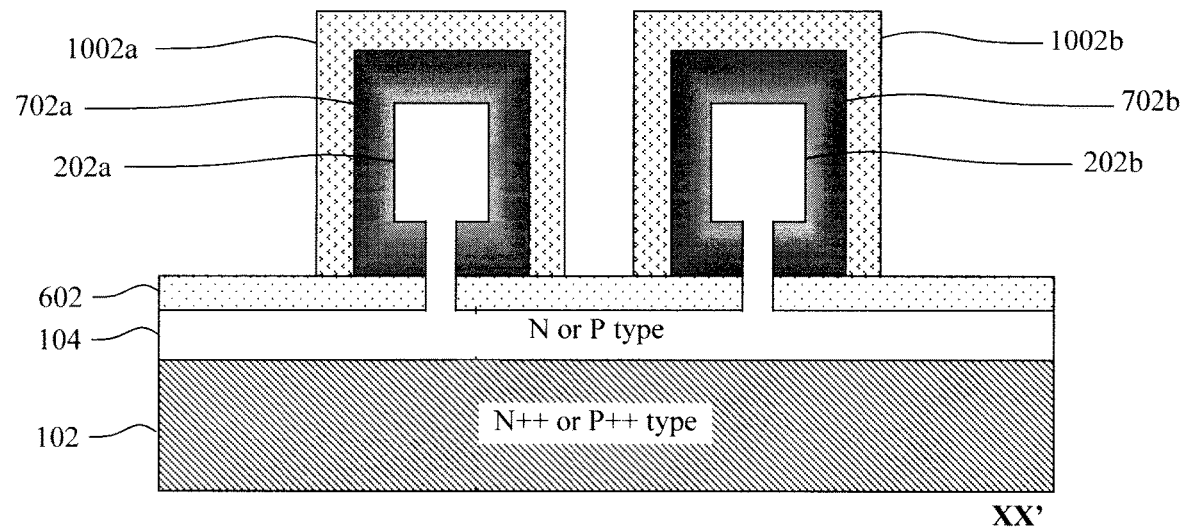
FIG. 10 is a cross-sectional diagram illustrating emitters having been formed wrapping around the bases according to an embodiment of the present invention.

Namely, as shown in FIG. 8 a conformal dopant source layer 802 is formed on the bases 702a and 702b. According to an exemplary embodiment, a process such as monolayer doping (MLD) is employed. In that case, dopant source layer 802 is formed as, e.g., a P- or B-containing a monolayer (i.e., a layer one atom thick), on bases 702a and 702b. See, for example, Kennedy et al., "Phosphorous monolayer doping (MLD) of silicon on insulator (SOI) substrates," Beilstein J. Nanotechnol. 2018, 9, pp. 2106-2113 (August 2018) and Ho et al., "Controlled nanoscale doping of semiconductors via molecular monolayers," nature materials, vol. 7, January 2008 (Published November 2007) (16 total pages), the contents of both of which are incorporated by reference as if fully set forth herein. Alternatively, a process such as plasma doping can be employed to form, e.g., a P- or B-containing dopant source layer 802 on bases 702a and 702b. Plasma doping is generally described in Qin et al., "PLAD (Plasma Doping) on 22 nm Technology Node and Beyond—Evolutionary and/or Revolutionary" 2012 $12^{th}$ International Workshop on Junction Technology (May 2012) (12 total pages), the contents of which are incorporated by reference as if fully set forth herein.

Following formation of dopant source layer 802 on bases 702a and 702b, the fins 202a and 202b are then buried in a dielectric 804. Following deposition, the dielectric 804 is planarized using a process such as chemical mechanical polishing (CMP). Suitable dielectrics include, but are not limited to, oxide materials such as silicon oxide (SiOx) and/or organosilicate glass (SiCOH) and/or ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-k dielectric materials include, but are not limited to, porous organosilicate glass (pSiCOH).

An anneal of the fins 202a and 202b is then performed to drive in the (n-type or p-type) dopants from the dopant source layer 802 into bases 702a and 702b. See FIG. 9. According to an exemplary embodiment, this drive-in anneal is performed at a temperature of from about 350° C. to about 850° C. and ranges therebetween. As shown in FIG. 9, this process can be used to create a dopant gradient in the bases 702a and 702b with a greatest concentration of the (n-type or p-type dopant) at the outer surfaces of bases 702a and 702b that gradually decreases moving in towards the fins 202a and 202b.

Following the drive-in anneal, the dielectric 804 is removed. For instance, an oxide-selective etch can be used to clear the dielectric 804 from the fins 202a and 202b/bases 702a and 702b.

Additionally, bases 702a and 702b (i.e., SiGe or a SiGe-containing material such as SiGeC) can be engineered to have Ge percentage (%) modulation. Namely, the Ge % in the SiGe bases 702a and 702b can vary (i.e., along a gradient) from the collector side to the emitter side of the bases 702a and 702b, whereby a lowest Ge % occurs at the outer surfaces of bases 702a and 702b (i.e., emitter side of bases 702a and 702b —see below) and gradually decreases moving in towards the fins 202a and 202b (i.e., collector side of bases 702a and 702b). For instance, by way of example only, the Ge % is from about 50% Ge to about 90% Ge and ranges therebetween on the collector side of bases 702a and 702b, and the Ge % is from about 10% Ge to about 20% Ge and ranges therebetween on the emitter side of bases 702a and 702b. According to an exemplary embodiment, the Ge % increases by from about 5% to about 15% and ranges therebetween every from about 10 nm to about 50 nm and ranges therebetween moving in from the surface of the bases 702a and 702b. For a general discussion of Ge % modulation see, for example, Dardy and U.S. Pat. No. 7,544,577 issued to Adam et al., entitled "Mobility Enhancement in SiGe Heterojunction Bipolar Transistors," the contents of both of which are incorporated by reference as if fully set forth herein.

Emitters 1002a and 1002b are then formed wrapping around bases 702a and 702b, respectively. See FIG. 10. According to an exemplary embodiment, emitters 1002a and 1002b are formed from Si or a Si-containing material such as SiC. Emitters 1002a and 1002b are highly doped with an n-type or p-type dopant. Suitable n-type and p-type dopants were provided above. According to an exemplary embodiment, emitters 1002a and 1002b have a dopant concentration of from about $1 \times 10^{20}$ at. % to about $5 \times 10^{20}$ at. % and ranges therebetween.

According to an exemplary embodiment, emitters 1002a and 1002b are formed by blanket depositing Si (or a Si-containing material such as SiC) over bases 702a and 702b, and then using standard lithography and etching techniques to pattern the Si into the individual emitters 1002a and 1002b. The dopants (n-type or p-type) can be introduced into the emitters 1002a and 1002b via an ion implantation process. Alternatively, according to another exemplary embodiment, the Si or Si-containing material (e.g., SiC) for emitters 1002a and 1002b is grown epitaxially on the bases 702a and 702b. In that case, doping can be performed in-situ (i.e., during growth) or ex-situ (e.g., by ion implantation).

Replacement sidewall spacers 1102 are then formed alongside the emitters 1002a and 1002b. Suitable materials for replacement sidewall spacers 1102 include, but are not limited to, oxide spacer materials such as $SiO_2$ and/or SiOC and/or nitride spacer materials such as SiN and/or SiBN. Replacement sidewall spacers 1102 can be formed by first blanket depositing the spacer material onto the BJT structure including along the sidewalls of emitters 1002a and 1002b. A directional (anisotropic) etching process such as RIE can then be used to pattern the spacer material into the individual replacement sidewall spacers 1102 shown in FIG. 11.

Figure 11:
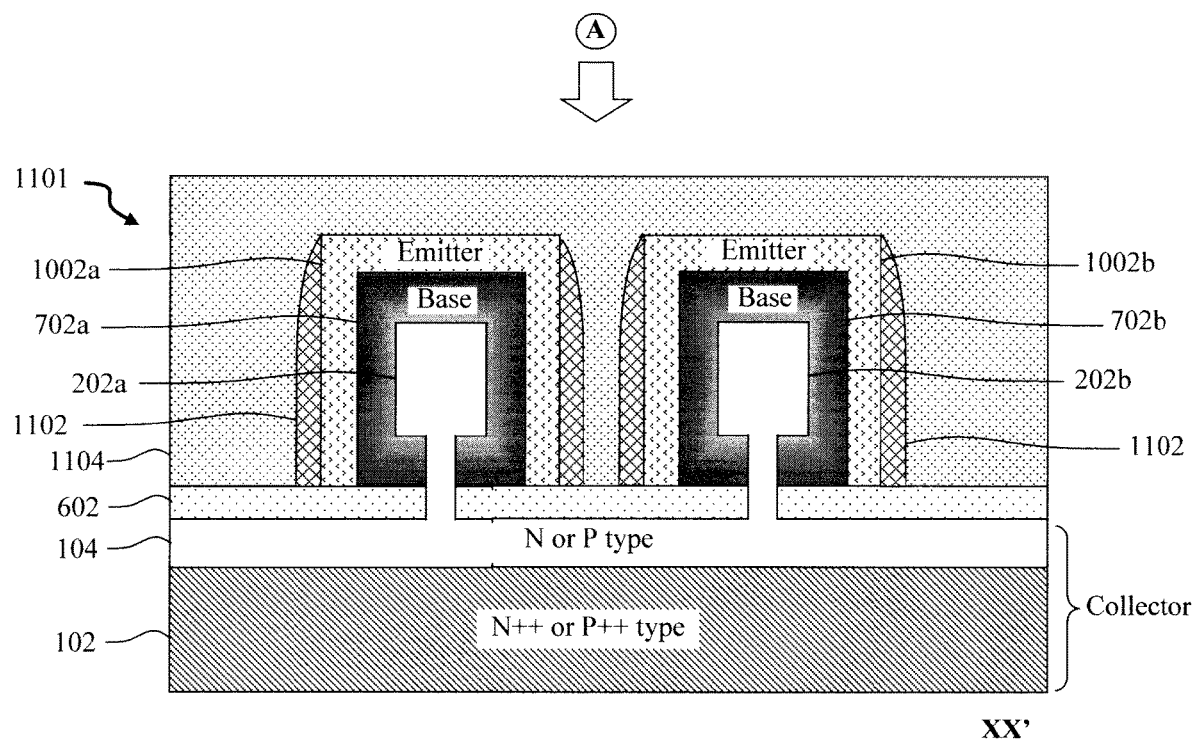
FIG. 11 is a cross-sectional diagram illustrating replacement sidewall spacers having been formed alongside the emitters according to an embodiment of the present invention.

As shown in FIG. 11, the present BJT 1101 has a collector and multiple bases 702a/702b and emitters 1002a/1002b. As provided above, N++ or P++ type layer 102 and N or P type layer 104 together form the collector, where the N++ or P++ type layer 102 serves to reduce the contact/series resistivity. The BJT 1101 is then buried/surrounded in a dielectric 1104.

Following deposition, the dielectric 1104 is planarized using a process such as CMP. As provided above, suitable dielectrics include, but are not limited to, oxide materials such as SiOx and/or SiCOH and/or ULK-ILD materials, such as pSiCOH.

Figure 12:
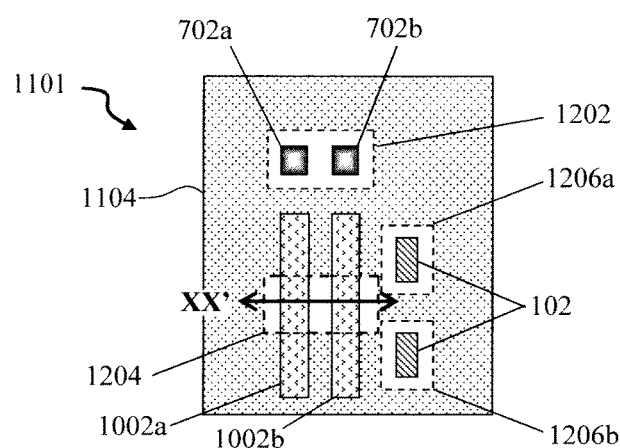
FIG. 12 is a top-down diagram illustrating first, second and at least one third contact trenches having been patterned in the dielectric exposing the bases, emitters, and N++ or P++ type layer (of the collector), respectively according to an embodiment of the present invention.
Figure 13:
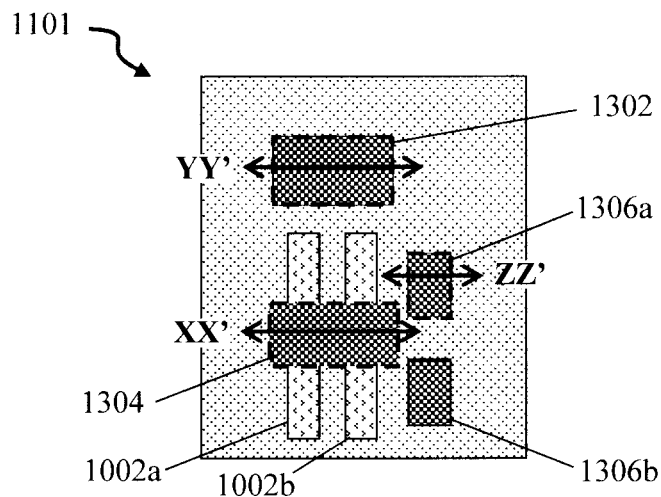
FIG. 13 is a top-down diagram illustrating first, second and at least one third contact trenches having been filled with a contact metal(s) to form first, second and at least one third contacts to the bases, emitters, and N++ or P++ type layer (of the collector), respectively according to an embodiment of the present invention.

Switching now to a top down view (e.g., from viewpoint A—see FIG. 11), standard lithography and etching techniques are next used to pattern contact trenches 1202, 1204 and 1206a/1206b in the dielectric 1104 exposing the bases 702a/702b, emitters 1002a/1002b, and N++ or P++ type layer 102 (of the collector), respectively. See FIG. 12. Notably, as provided above, FIG. 12 shows the orientation of the cuts XX' illustrated in the preceding cross-sectional views. For clarity, the terms first, second and third may also be used herein when referring to contact trenches 1202, 1204 and 1206a/1206b, respectively.

The contact trenches 1202, 1204 and 1206a/1206b are then filled with a contact metal(s) to form contacts 1302, 1304 and 1306a/1306b to the bases 702a/702b, emitters 1002a/1002b, and N++ or P++ type layer 102 (of the collector), respectively. See FIG. 13. Again, the terms first, second and third may also be used herein when referring to contacts 1302, 1304 and 1306a/1306b, respectively. Suitable contact metals include, but are not limited to, nickel (Ni), copper (Cu), platinum (Pt), palladium (Pd) and/or gold (Au).

Figure 14:
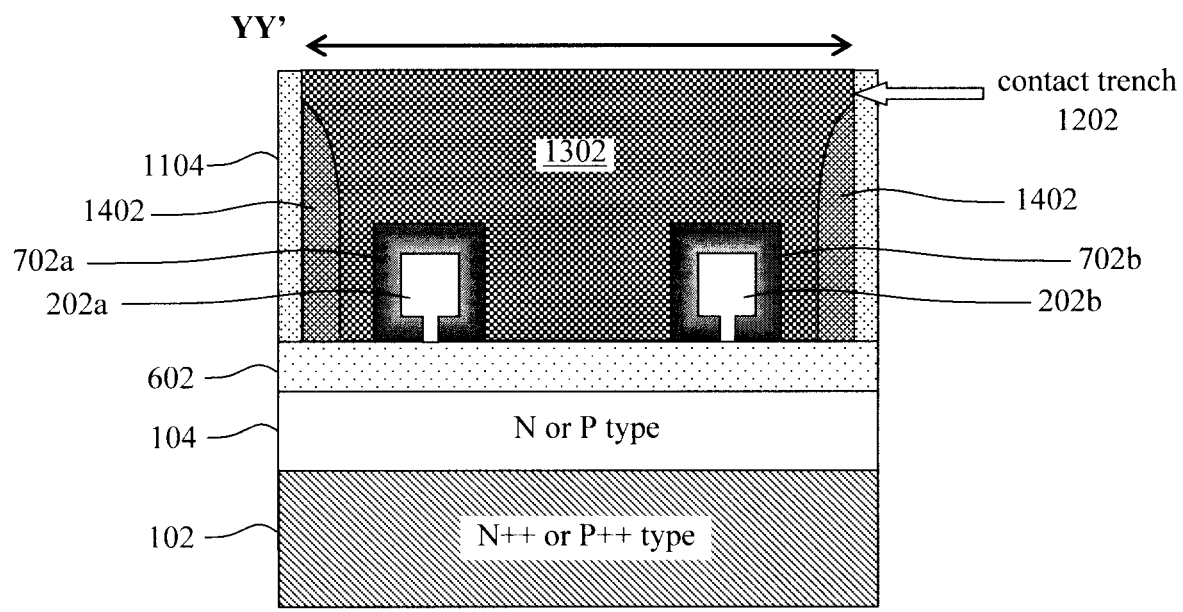
FIG. 14 is a cross-sectional diagram illustrating the first contact to the bases according to an embodiment of the present invention.

A cross-sectional view (YY'—see FIG. 13) of contact 1302 to bases 702a/702b is shown in FIG. 14. As shown in FIG. 14, a liner 1402 is first formed lining the sidewalls of contact trench 1202, followed by a metal fill with one or more of the above-provided contact metals to form contact 1302 to bases 702a/702b. Suitable materials for liner 1402 include, but are not limited to, oxide liner materials such as $SiO_2$ and/or SiOC and/or nitride liner materials such as SiN and/or SiBN. By way of example only, liner 1402 can be formed by first blanket depositing the liner material into contact trench 1202. A directional (anisotropic) etching process such as RIE can then be used to pattern the liner material into liner 1402 along the sidewalls of contact trench 1202.

Figure 15:
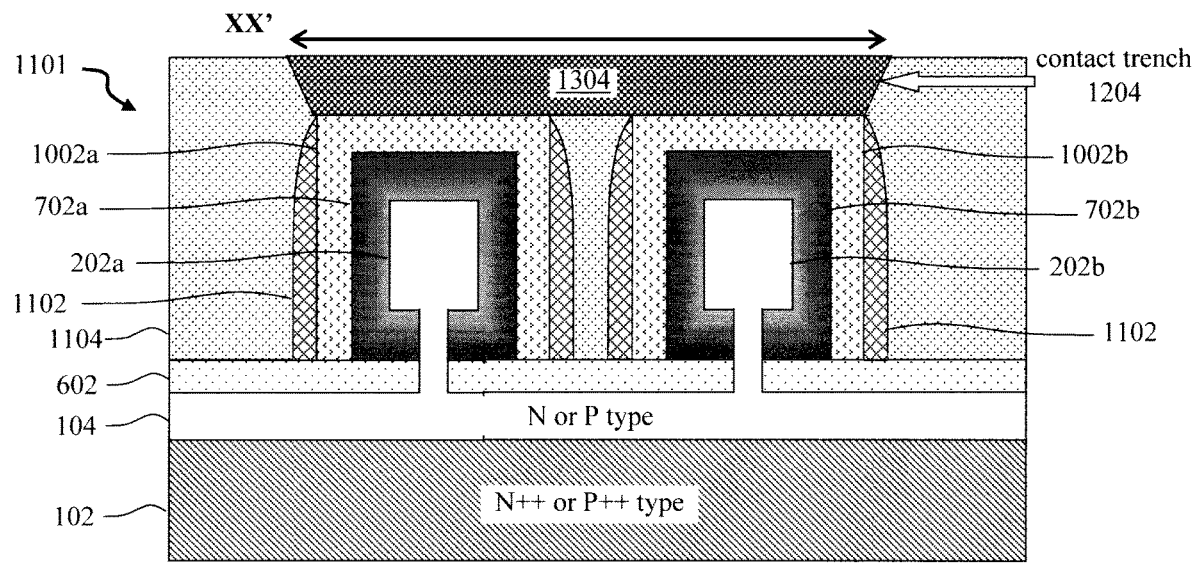
FIG. 15 is a cross-sectional diagram illustrating the second contact to the emitters according to an embodiment of the present invention.

A cross-sectional view (XX'—see FIG. 13) of contact 1304 to emitters 1002a/1002b is shown in FIG. 15. As shown in FIG. 15, contact 1304 is formed by a metal fill with one or more of the above-provided contact metals into contact trench 1204.

Figure 16:
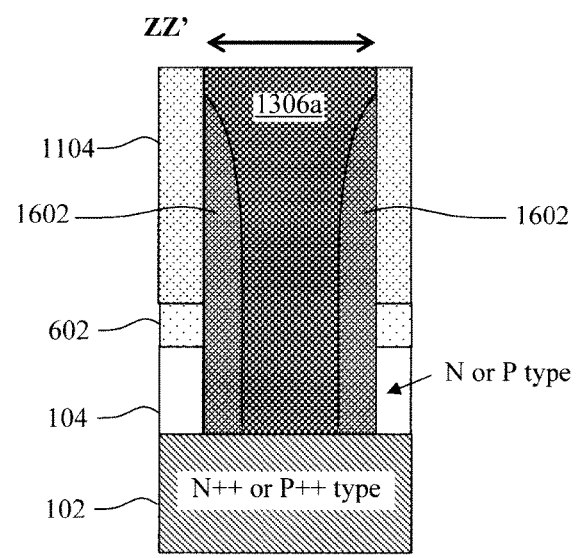
FIG. 16 is a cross-sectional diagram illustrating one of the third contacts to the N++ or P++ type layer (of the collector) according to an embodiment of the present invention.

A cross-sectional view (ZZ'—see FIG. 13) of one of the contacts (i.e., contact 1306a) to N++ or P++ type layer 102 (of the collector), is shown in FIG. 16. As shown in FIG. 16, a liner 1602 is first formed lining the sidewalls of contact trench 1206a, followed by a metal fill with one or more of the above-provided contact metals to form contact 1306a to N++ or P++ type layer 102 of the collector. Suitable materials for liner 1602 include, but are not limited to, oxide liner materials such as $SiO_2$ and/or SiOC and/or nitride liner materials such as SiN and/or SiBN. As provided above, liner 1602 can be formed by first blanket depositing the liner material into contact trench 1206a. A directional (anisotropic) etching process such as RIE can then be used to pattern the liner material into liner 1602 along the sidewalls of contact trench 1206a.

In the exemplary embodiment described above, the bottom of fins 202a and 202b was thinned, for example, to enlarge the surface area of the fins 202a and 202b around which the base is formed. However, as provided above, this thinning step is optional, and embodiments are contemplated herein where the bottom of the fins 202a and 202b are left at their as-patterned width. See, for example FIGS. 17 and 18. Like structures are numbered alike in the figures.

Figure 17:
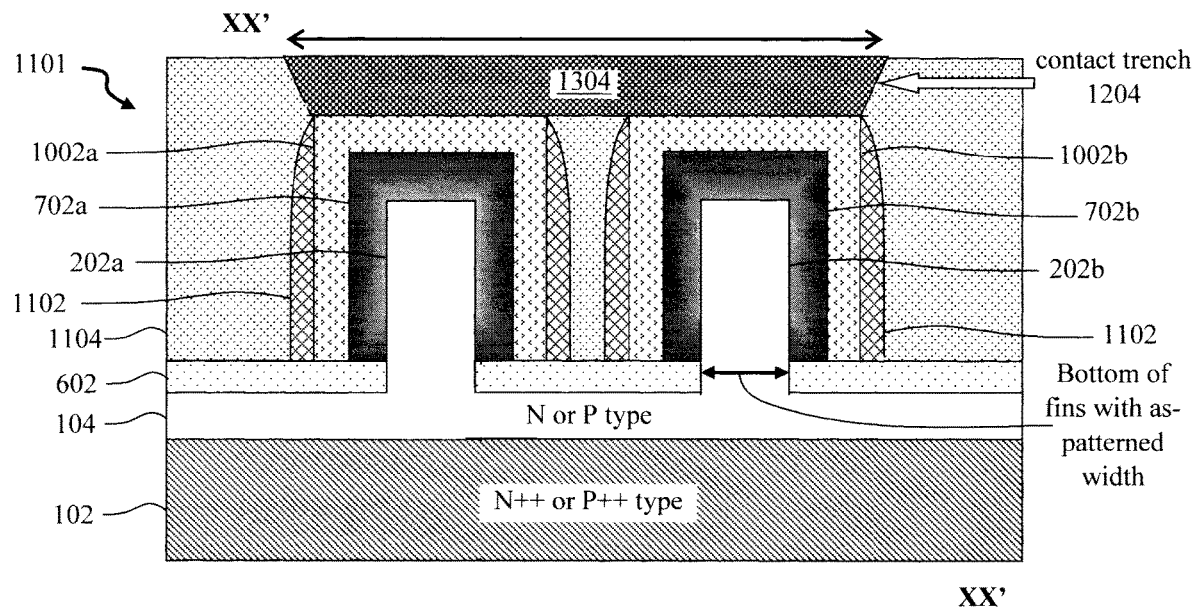
FIG. 17 is a cross-sectional diagram illustrating the second contact to the emitters according to an alternative embodiment where the bottom of the fins has its as-patterned thickness according to an embodiment of the present invention.

As shown in FIG. 17, i.e., a cross-sectional view (XX'—see FIG. 13) of contact 1304 to emitters 1002a/1002b according to an alternative embodiment, the bottom of fins 202a and 202b has its as-patterned thickness. Compare FIG. 15 and FIG. 17. Namely, in the previous example, fins 202a and 202b were first patterned, and then thinned to reduce their width at the bottom. Here, the thinning step is eliminated, thereby providing fins 202a and 202b at their as-patterned width.

Figure 18:
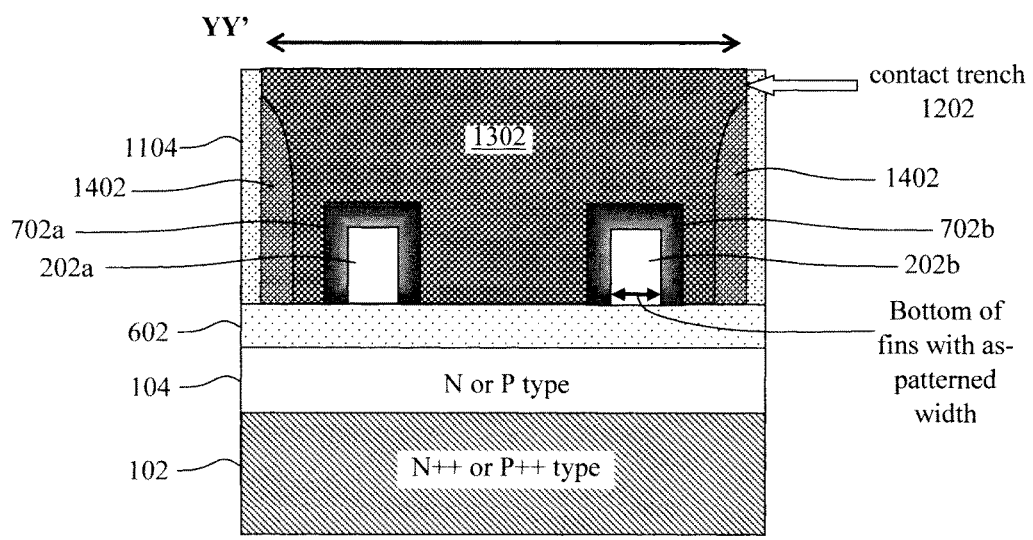
FIG. 18 is a cross-sectional diagram illustrating the first contact to the bases according to an alternative embodiment where the bottom of the fins has its as-patterned thickness according to an embodiment of the present invention.

Similarly, a cross-sectional view (YY'—see FIG. 13) of contact 1302 to bases 702a/702b according to this alternative embodiment, is shown in FIG. 18. As shown in FIG. 18, the bottom of fins 202a and 202b has its as-patterned thickness. Compare FIG. 14 and FIG. 18.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a bipolar junction transistor (BJT) device, the method comprising the steps of:
    forming a substrate comprising a first doped layer having a dopant concentration of from about $1\times10^{20}$ atomic percent (at. %) to about $5\times10^{20}$ at. %, and a second doped layer disposed on the first doped layer having a dopant concentration of from about $1\times10^{15}$ at. % to about $1\times10^{18}$ at. %, wherein the first doped layer and the second doped layer comprise a collector of the BJT device;
    patterning at least one fin in the substrate;
    forming bottom spacers at a bottom of the at least one fin;
    forming at least one base that wraps around the at least one fin;
    forming at least one emitter that wraps around the at least one base; and
    forming sidewall spacers alongside the at least one emitter.

2. The method of claim 1, further comprising the step of: burying the BJT device in a dielectric.

3. The method of claim 2, further comprising the steps of: patterning i) a first contact trench in the dielectric exposing the at least one base, ii) a second contact trench in the dielectric exposing the at least one emitter, and iii) at least one third contact trench in the dielectric exposing the collector; and
    filling the first contact trench, the second contact trench and the at least one third contact trench with a contact metal.

4. The method of claim 3, further comprising the step of: forming a liner along sidewalls of the first contact trench and the at least one third contact trench.

5. The method of claim 1, wherein the first doped layer and the second doped layer are each doped with an n-type or a p-type dopant.

6. The method of claim 1, wherein the first doped layer and the second doped layer each comprises silicon (Si).

7. The method of claim 1, wherein the substrate is formed using an ion implantation process.

8. The method of claim 1, wherein the substrate is formed using an epitaxial growth process.

9. The method of claim 1, wherein at least one fin extends only partway through the second doped layer.

10. The method of claim 1, further comprising the step of: thinning the bottom of the at least one fin.

11. The method of claim 10, further comprising the steps of:
    forming sacrificial bottom spacers at the bottom of the at least one fin;
    forming sacrificial sidewall spacers alongside the at least one fin above the sacrificial bottom spacers;
    selectively removing the sacrificial bottom spacers to expose the bottom of the at least one fin;
    thinning the bottom of the at least one fin beneath the sacrificial sidewall spacers; and
    removing the sacrificial sidewall spacers.

12. The method of claim 10, wherein the bottom of the at least one fin is thinned from a width W1 to a width W2, wherein W1 is from about 3 nm to about 8 nm, and wherein W2 is from about 1 nm to about 5.

13. The method of claim 1, wherein the at least one base comprises silicon germanium (SiGe).

14. The method of claim 1, wherein the at least one base is doped with an n-type or a p-type dopant at a dopant concentration of from about $1\times10^{15}$ at. % to about $1\times10^{18}$ at. %.

15. The method of claim 14, wherein the at least one base comprises a dopant gradient whereby a greatest concentration of the n-type or p-type dopant occurs at the outer surfaces of at least one base and gradually decreases in towards the at least one fin.

16. The method of claim 15, further comprising the steps of:
    forming a dopant source layer on the at least one base comprising the n-type or p-type dopant;
    burying the at least one fin in a dielectric; and
    annealing the at least one fin to drive in the n-type or p-type dopant from the dopant source layer into the at least one base.

17. The method of claim 1, wherein the at least one emitter comprises Si.

18. The method of claim 1, wherein the at least one emitter is doped with an n-type or a p-type dopant at a dopant concentration of from about $1\times10^{20}$ at. % to about $5\times20^{20}$ at. %.

19. A BJT device, comprising:
    a substrate comprising a first doped layer having a dopant concentration of from about $1\times10^{20}$ at. % to about $5\times10^{20}$ at. %, and a second doped layer disposed on the first doped layer having a dopant concentration of from about $1\times10^{15}$ at. % to about $1\times10^{18}$ at. %, wherein the first doped layer and the second doped layer comprise a collector of the BJT device;
    at least one fin patterned in the substrate that extends partway through the second doped layer;
    bottom spacers disposed at a bottom of the at least one fin;
    at least one base that wraps around the at least one fin;
    at least one emitter that wraps around the at least one base;
    sidewall spacers disposed alongside the at least one emitter;
    a dielectric surrounding the BJT device;
    a first contact in the dielectric to the at least one base;
    a second contact in the dielectric to the at least one emitter;
    and at least one third contact in the dielectric to the collector.

20. The BJT device of claim 19, wherein the bottom of the at least one fin is thinned.

* * * * *